United States Patent
Wei et al.

(10) Patent No.: US 8,067,965 B2
(45) Date of Patent: Nov. 29, 2011

(54) CLOCK AND DATA RECOVERY CIRCUIT WITH PROPORTIONAL PATH

(75) Inventors: Cheng-Ta Wei, Hsinchu (TW); Ming-Shih Yu, Hsinchu (TW)

(73) Assignee: Faraday Technology Corp., Science-Base Industrial Park, Hsin-Chu (TW)

( * ) Notice: Subject to any disclaimer, the term of this patent is extended or adjusted under 35 U.S.C. 154(b) by 0 days.

(21) Appl. No.: 12/859,957

(22) Filed: Aug. 20, 2010

(65) Prior Publication Data
US 2011/0156777 A1 Jun. 30, 2011

(30) Foreign Application Priority Data
Dec. 31, 2009 (TW) ................................ 98146509 A

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 7,256,656 B2 * | 8/2007 | Wu ................................ | 331/17 |
| 7,403,073 B2 * | 7/2008 | Kossel et al. .................... | 331/16 |
| 7,633,322 B1 * | 12/2009 | Zhuang et al. ................ | 327/156 |
| 7,756,235 B2 * | 7/2010 | Aziz et al. ...................... | 375/373 |
| 7,772,900 B2 * | 8/2010 | Ainspan et al. ................ | 327/159 |
| 7,994,829 B2 * | 8/2011 | Hsieh et al. .................... | 327/156 |
| 2007/0002993 A1 * | 1/2007 | Wang et al. .................... | 375/374 |
| 2011/0018597 A1 * | 1/2011 | Lee et al. ....................... | 327/156 |

* cited by examiner

*Primary Examiner* — Lincoln Donovan
*Assistant Examiner* — Adam Houston
(74) *Attorney, Agent, or Firm* — Winston Hsu; Scott Margo

(57) ABSTRACT

A clock and data recovery circuit includes a phase detector, a charge pump, a loop filter, a voltage-controlled oscillator and a frequency divider. The voltage-controlled oscillator includes a current mirror, a control circuit, a current modulation module and a current-controlled oscillator. The current mirror has a current-controlling path and a current-outputting path. The current-controlling path and the current-outputting path are in a proportional relationship. The control circuit is used for adjusting the current flowing through the current-controlling path according to the control voltage. The current modulation module is used for generating a differential current according to the judging signal. The current-controlled oscillator is used for adjusting the phase of the second output clock signal according to the sum of the differential current and the current flowing through the current-outputting path.

13 Claims, 5 Drawing Sheets

CLOCK AND DATA RECOVERY CIRCUIT WITH PROPORTIONAL PATH

FIELD OF THE INVENTION

The present invention relates to a clock and data recovery circuit, and more particularly to a clock and data recovery circuit with a proportional path.

BACKGROUND OF THE INVENTION

A phase detector (PD) is widely used for receiving a data signal and an output clock signal, and comparing the data signal with the output clock signal, thereby generating a judging signal. For example, the use of the phase detector is common in phase locked loop (PLL) circuits, for precisely controlling the clock and frequency. In addition, the PLL circuit is important for clock and data recovery (CDR) circuits.

FIG. 1A is a schematic diagram illustrating a correction strategy of a linear phase detector. For the linear phase detector, as the phase difference φ increases, the phase-correcting amount Δφ increases in a direct proportion. That is, the phase difference φ and the phase-correcting amount Δφ are in a linear relationship. If the phase difference φ is positive, the phase-correcting amount Δφ is subtracted from the original phase. Whereas, if the phase difference φ is negative, the phase-correcting amount Δφ is added to the original phase.

FIG. 1B is a schematic diagram illustrating a correction strategy of a bang-bang phase detector. The bang-bang phase detector is a non-linear phase detector. After the phase difference is detected, depending on the positive or negative feature of the phase difference, a constant phase-correcting amount Δφ is subtracted from or added to the original phase. If any phase difference still exists after the correction step, the similar correction steps are repeated done to successively correct the original difference by the constant phase-correcting amount Δφ. For example, assuming that the phase difference φ between the data signal and the clock signal inputted into the phase detector is positive, the constant phase-correcting amount Δφ is subtracted from the original phase, and thus a judging signal $V_{down}$ is outputted from the bang-bang phase detector. Whereas, if the phase difference φ is negative, the constant phase-correcting amount Δφ is added to the original phase, and thus a judging signal $V_{up}$ is outputted from the bang-bang phase detector.

From the above discussions, it is found that the correcting procedure of the linear phase detector may be stopped because the error is nearly negligible. On the other hand, since the sampling values acquired by the bang-bang phase detector are usually unequal, the correcting procedure of the bang-bang phase detector may be continuously performed because of the existence of the phase difference φ. In addition, even if the corrected value is very close to the ideal value, the corrected value may swing up and down with respect to the ideal value. Due to these characteristics, the bang-bang phase detector is also referred as a binary phase detector. Since the bang-bang phase detector does not need to calculate the tuning range according to the magnitude of the phase difference φ and the tuning speed of the bang-bang phase detector is faster than the linear phase detector, the bang-bang phase detector is employed in high-speed data transmission.

FIG. 2 is a schematic circuit diagram illustrating a clock and data recovery circuit using a bang-bang phase detector according to the prior art. As shown in FIG. 2, the clock and data recovery circuit comprises a bang-bang phase detector 101, a charge pump (CP) 103, a loop filter (LF) 105 and a voltage-controlled oscillator (VCO) 107. By the bang-bang phase detector 101, a judging signal ($V_{up}$, $V_{down}$) is acquired. The judging signal is converted into control voltage by the charge pump (CP) 103 and the loop filter (LF) 105. According to the control voltage, the voltage-controlled oscillator adjusts the phase of an output clock signal.

Please refer to FIG. 2 again. The charge pump 103 comprises a first current source 1031, a second current source 1032, a first switch 1033 and a second switch 1034. The first current source 1031 is connected to a high-level voltage for providing a first switching current. The second current source 1032 is connected to a low-level voltage for providing a second switching current. The first switch 1033 is interconnected between the first current source 1031 and the loop filter 105. According to the judging signal outputted from the bang-bang phase detector 101, the first switch 1033 is conducted or shut off to determine whether the first switching current is outputted or not. The second switch 1034 is interconnected between the second current source 1032 and the loop filter 105. Similarly, according to the judging signal outputted from the bang-bang phase detector 101, the second switch 1034 is conducted or shut off to determine whether the second switching current is outputted or not. As such, a switching signal indicative of the combination of the first switching current and the second switching current will be transmitted to the back-end circuit.

The switching signal outputted from the charge pump 103 is generated according to the judging signal ($V_{up}$, $V_{down}$). According to the switching signal, a control voltage $V_{LF}$ at a control node of the loop filter 105 is adjusted. According to the control voltage $V_{LF}$, the output oscillation feature of the voltage-controlled oscillator 107 is adjusted. For example, in a case that the judging signal ($V_{up}$, $V_{down}$)=(0, 0) is transmitted from the bang-bang phase detector 101 to the charge pump 103, the first switch 1033 and the second switch 1034 of the charge pump 103 are both shut off, and thus the control voltage $V_{LF}$ to be transmitted to the voltage-controlled oscillator 107 is kept unchanged. Whereas, in response to the judging signal ($V_{up}$, $V_{down}$)=(0, 1), the second switch 1034 is conducted and the second switching current is generated. Due to the second switching current, an integral capacitor $C_1$ of the loop filter 105 begins to discharge, and thus the magnitude of the control voltage $V_{LF}$ decreases. Whereas, in response to the judging signal ($V_{up}$, $V_{down}$)=(1, 0), the first switch 1033 is conducted and the first switching current is generated. Since the integral capacitor $C_1$ of the loop filter 105 is charged by the first switching current, the magnitude of the control voltage $V_{LF}$ increases. Moreover, in response to the judging signal ($V_{up}$, $V_{down}$)=(1, 1), the first switch 1033 and the second switch 1034 are both conducted, and thus the first switching current and the second switching current are generated. Since the first switching current and the second switching current flow toward the low-level voltage side, neither a charging operation nor a discharging operation on the loop filter 105 is performed.

From the above discussions, it is found that the actions of the first switch 1033 and the second switch 1034 of the charge pump 103 affect the operations of the loop filter 105 and the voltage-controlled oscillator 107. That is, after the charging operation on the loop filter 105 is stopped by controlling on/off statuses of the switches 1033 and 1034, the charges accumulated in the integral capacitor $C_1$ of the loop filter 105 still have influences on the voltage inputted into the voltage-controlled oscillator 107. On the other hand, since the resistor R of the loop filter 105 does not have the memory effect, the voltage inputted into the voltage-controlled oscillator 107 is not affected by the resistor R. In other words, the resistor R is able to respond to the instantaneous actions of the switches without adversely affecting voltage inputted into the voltage-controlled oscillator 107.

That is, the resistor R and the integral capacitor $C_1$ of the loop filter 105 affect the performance of the instantaneous response and the sustained response, respectively. Generally, the resistor R is suitable to instantaneous phase adjustment, but the integral capacitor $C_1$ is suitable to frequency adjustment. However, because of the following reasons, the performance of the architecture of the clock and data recovery circuit as shown FIG. 2 is unsatisfied in high-speed applications.

Firstly, since the resistor R and the integral capacitor $C_1$ are included in the loop filter 105, the high-speed phase control feature and the low-speed frequency control feature of the resistor R and the integral capacitor $C_1$ should be taken into consideration when designing the loop filter 105. In addition, when the clock and data recovery circuit is used in high-speed applications, the circuitry of charge pump 103 should be correspondingly changed to comply with the back-end circuit. That is, the complexity of designing the charge pump 103 increases.

Secondly, the loop stability is adversely affected by a parasitic capacitor $C_p$. As shown in FIG. 2, the parasitic capacitor $C_p$ gives rise to third-order effects because the original second-order loop becomes a third-order loop (having an additional pole). The third-order effects may degrade the loop stability and make the loop design difficult, particularly at high frequencies. (See, Wang, Shoujun, etc, "Design considerations for 2nd-order and 3rd-order bang-bang CDR loops, FIG. 5" 2005 IEEE Custom Integrated Circuits Conference (CICC 2005), San Jose, Calif., Sep. 18-21, 2005).

Moreover, for eliminating the influence of noise, the main circuit is usually equipped with some decoupling capacitors to filter off high-frequency noise. Like the parasitic capacitor $C_p$, the uses of these decoupling capacitors may give rise to third-order effects to slow down the response speed.

From the above discussions, the loop filter 105 consisting of the resistor R and the integral capacitor $C_1$ may restrict the applications of the clock and data recovery circuit at high frequencies.

SUMMARY OF THE INVENTION

The present invention provides a clock and data recovery circuit. The clock and data recovery circuit includes a phase detector, a charge pump, a loop filter, a voltage-controlled oscillator and a frequency divider. The phase detector is used for receiving a data signal and a first output clock signal, and comparing the data signal with the first output clock signal, thereby generating a judging signal. The charge pump is electrically connected to the phase detector for generating a switching signal according to the judging signal. The loop filter is electrically connected to the charge pump for receiving the switching signal and generating a corresponding control voltage. The voltage-controlled oscillator is connected to the loop filter and the phase detector for generating a second output clock signal and adjusting the frequency of the second output clock signal according to the control voltage. The voltage-controlled oscillator includes a current mirror, a control circuit, a current modulation module and a current-controlled oscillator. The current mirror has a current-controlling path and a current-outputting path. The current-controlling path and the current-outputting path are in a proportional relationship. The control circuit is electrically connected to the loop filter and the current-controlling path for adjusting the current flowing through the current-controlling path according to the control voltage. The current modulation module is used for generating a differential current according to the judging signal. The current-controlled oscillator is electrically connected to the current-outputting path and the current modulation module for adjusting the phase of the second output clock signal according to the sum of the differential current and the current flowing through the current-outputting path. The frequency divider is electrically connected to the current-controlled oscillator for performing frequency division on the second output clock signal, thereby generating the first output clock signal.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

For minimizing the adverse effects resulted from the inconsistent characteristics of the resistor and the capacitor of the loop filter, a clock and data recovery circuit with a proportional path has been disclosed.

Figure 1A:
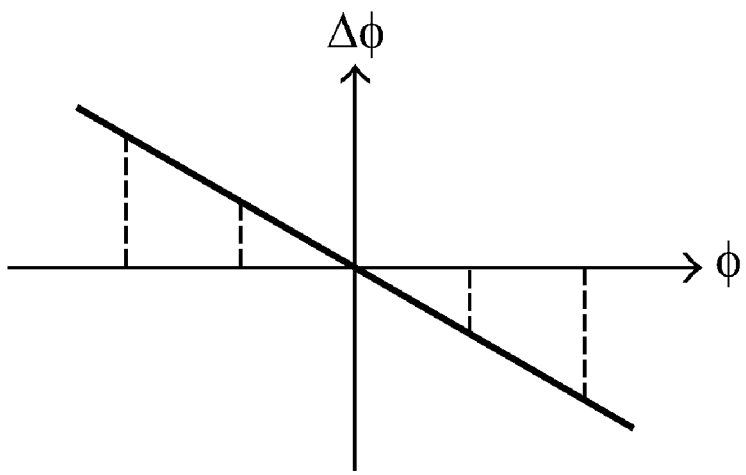
FIG. 1A is a schematic diagram illustrating a correction strategy of a linear phase detector.
Figure 1B:
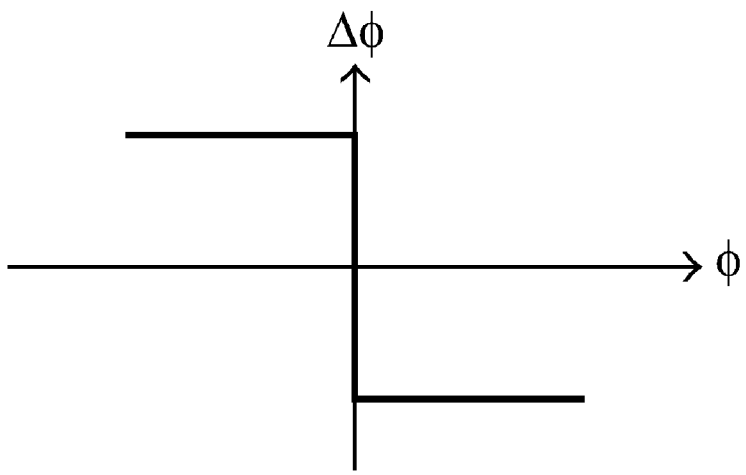
FIG. 1B is a schematic diagram illustrating a correction strategy of a bang-bang phase detector.
Figure 2:
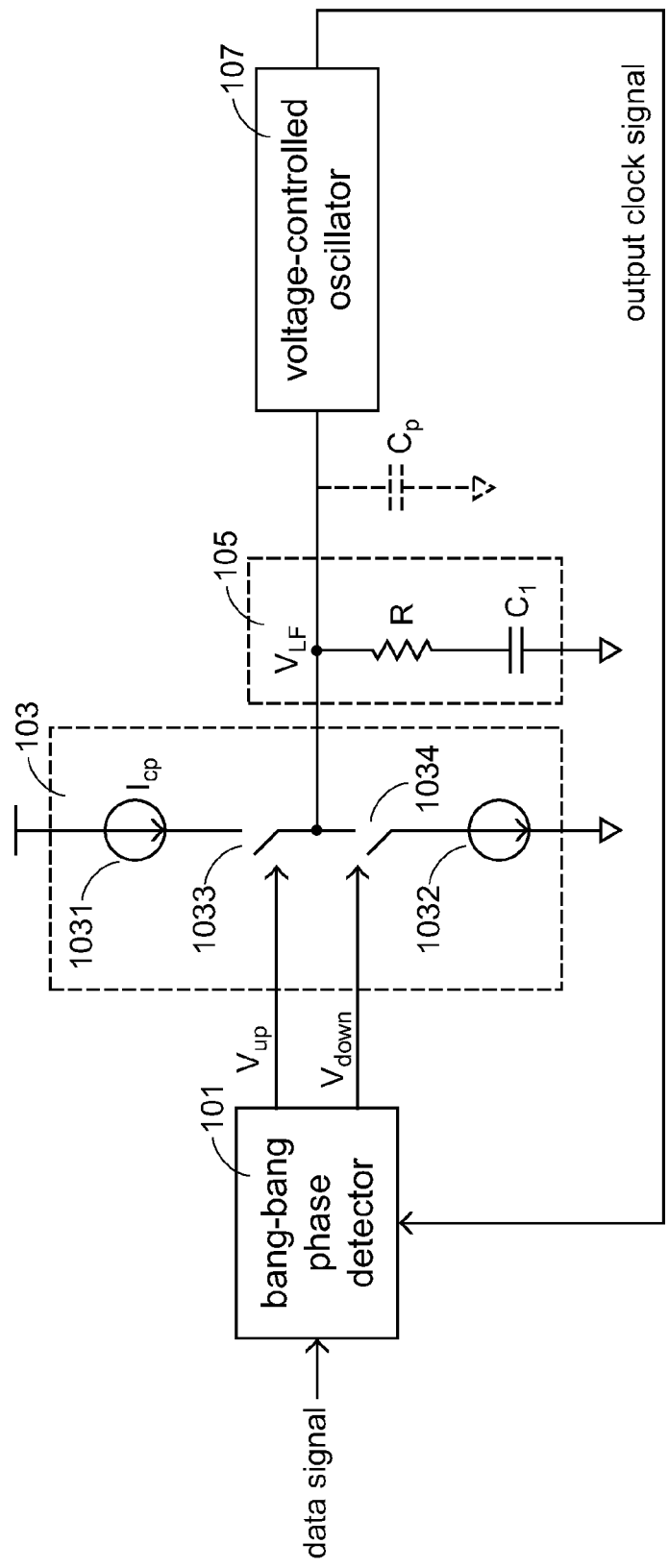
FIG. 2 is a schematic circuit diagram illustrating a clock and data recovery circuit using a bang-bang phase detector according to the prior art.
Figure 3A:
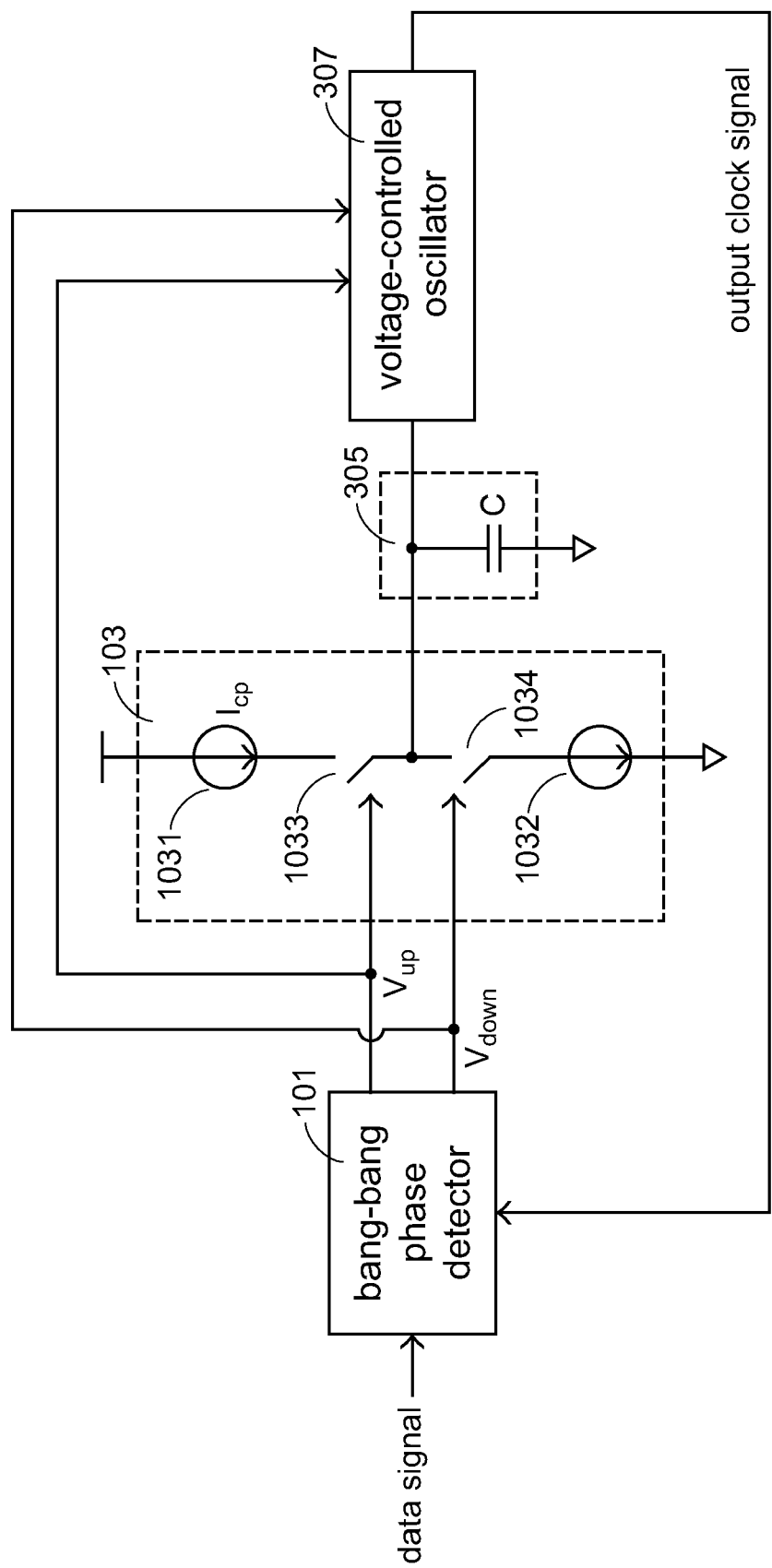
FIG. 3A is a schematic circuit diagram illustrating a clock and data recovery circuit with a proportional path.

FIG. 3A is a schematic circuit diagram illustrating a clock and data recovery circuit with a proportional path. As shown in FIG. 3A, the clock and data recovery circuit comprises a bang-bang phase detector 101, a charge pump (CP) 103, a loop filter (LF) 305 and a voltage-controlled oscillator (VCO) 307. In comparison with the CDR circuit shown in FIG. 2 where the resistor and the integral capacitor of the loop filter are connected with each other in series, the loop filter 305 included in the clock and data recovery circuit of this embodiment only comprises an integral capacitor C. The integral capacitor C is interconnected between the output side of the charge pump 103 and the voltage-controlled oscillator 307. In addition, the bang-bang phase detector 101 is further connected with the voltage-controlled oscillator 307, so that the judging signal ($V_{up}$, $V_{down}$) is also transmitted to the voltage-controlled oscillator 307.

In this architecture, the clock and data recovery circuit may be divided into two paths. The first path is a proportional path from the output side of the bang-bang phase detector 101 to the voltage-controlled oscillator 307. The second path is an integral path from the integral capacitor C to the voltage-controlled oscillator 307.

The clock and data recovery circuit with a separate proportional path and a separate integral path has many benefits. For example, the high-response phase adjustment may be performed through the proportional path in order to meet the requirements of high and low frequency applications. Moreover, since only the integral capacitor C is retained in the integral path, the charging or discharging operation of the integral capacitor is performed according to the switching signal. The capacitors (e.g. the decoupling capacitors and the parasitic capacitor $C_p$) outside the main circuit are connected with the integral capacitor C in parallel to result in an equivalent capacitance $C_{eq}$. Under this circumstance, the parasitic capacitor $C_p$ will no longer increase the order of the loop.

In other words, since the capacitors outside the main circuit are absorbed by the original integral capacitor C of the integral path, no addition pole is generated and the third-order effects will be eliminated. As such, the problem of degrading the loop stability at high frequencies due to the third-order effects will be eliminated.

Figure 3B:
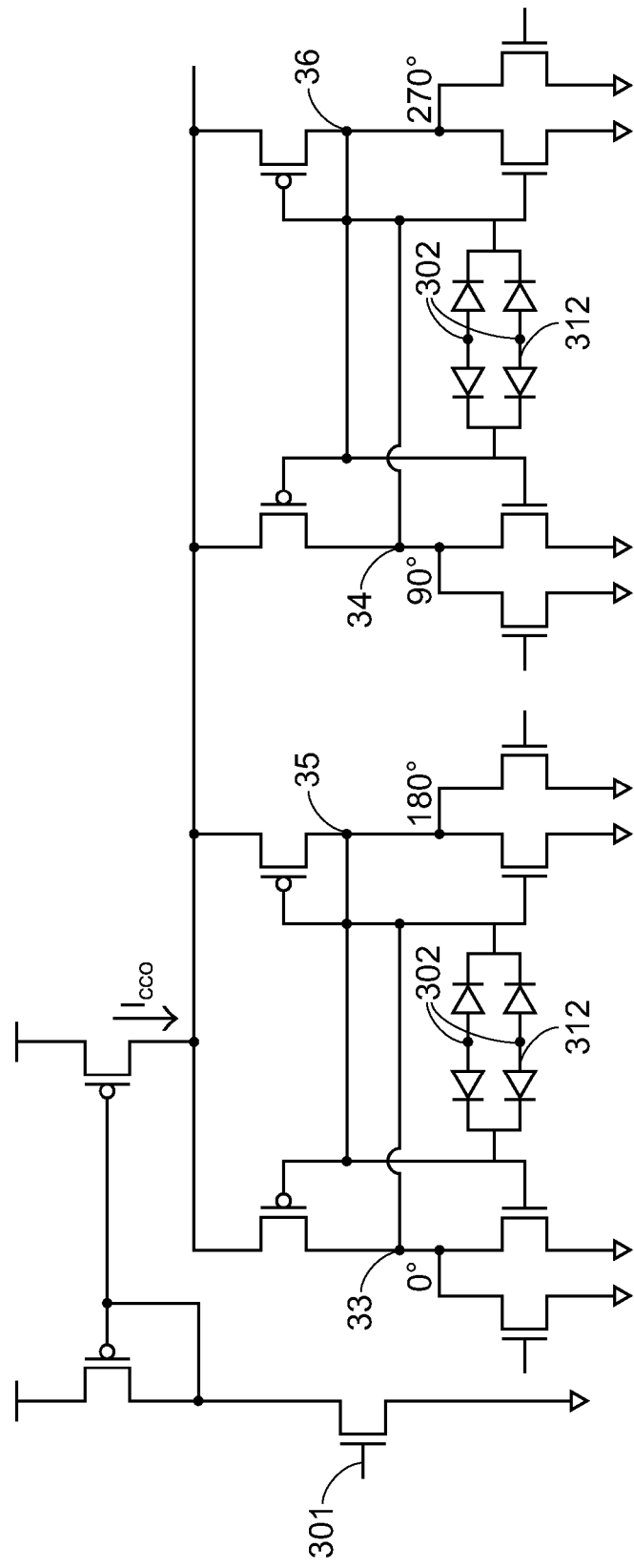
FIG. 3B is a schematic circuit diagram illustrating the voltage-controlled oscillator used in clock and data recovery circuit of FIG. 3A.

FIG. 3B is a schematic circuit diagram illustrating the voltage-controlled oscillator used in clock and data recovery circuit of FIG. 3A. The detailed configurations of the voltage-controlled oscillator 307 may be illustrated by reference to U.S. Pat. No. 7,580,497 B2.

The voltage-controlled oscillator 307 provides quadrature phase clocks 33, 34, 35 and 36. In addition, the voltage-controlled oscillator 307 has two input nodes 301 and 302. The input node 301 is a primary input node. The input node 302 is a secondary input node. The primary input node 301 is connected to the output end of the loop filter 305 for determining the tuning range of the voltage-controlled oscillator 307. The secondary input node 302 is connected to the proportional path of the bang-bang phase detector 101 for determining the bang-bang step frequency $f_{bb}$. Since the bang-bang step frequency $f_{bb}$ is on the order of 0.1% of the VCO center frequency, the capacitance of the varactor 312 which is connected to the secondary input node 302 needs be only large enough to provide such a step frequency $f_{bb}$.

Although the use of the proportional path may solve the problems in the high-speed applications, the voltage-controlled oscillator shown in FIG. 3B incurs some drawbacks. First, since the primary input node 301 of the voltage-controlled oscillator 307 is connected to the output side of the charge pump 103, the charge pump 103 should provide the high-frequency signal to the voltage-controlled oscillator 307. In other words, the circuitry complexity of designing the charge pump 103 increases. Second, the voltage inputted into the secondary input node 302 of the varactor 312 is the judging signal outputted from the bang-bang phase detector 101. During dynamic operation of the clock and data recovery circuit, there is usually a lag from the output side of the bang-bang phase detector 101 to the secondary input node 302. That is, there is a time delay between the timing required to adjust the phase and the actual timing of adjusting the phase. The time delay gives rise to deviation of the sampling phase, and thus creates a jitter. The rapid alteration between frequencies creates a hunting jitter. Since it is difficult to adjust the hunting jitter, the response sensitivity of the voltage-controlled oscillator 307 is usually unsatisfied and needs to be improved. Third, since the capacitance value is affected by the varactor 312 and the fabricating process, the circuitry behavior fails to be precisely realized.

From the above discussion, the clock and data recovery circuit with a separate proportional path and a separate integral path can reduce the circuitry complexity when the high and low frequency applications are both taken into consideration. However, since the output ends of the loop filter 305 and the bang-bang phase detector 101 are respectively connected with the primary input node 301 and the secondary input node 302 of the voltage-controlled oscillator 307 for adjusting phase, this analog-correcting method fails to precisely adjust phase. In addition, since the charge pump 103 should comply with the voltage-controlled oscillator 307, the complexity of designing the charge pump 103 increases. Therefore, there is a need of providing a clock and data recovery circuit capable of operating in high-speed applications while simplifying the circuitry design.

Figure 4:
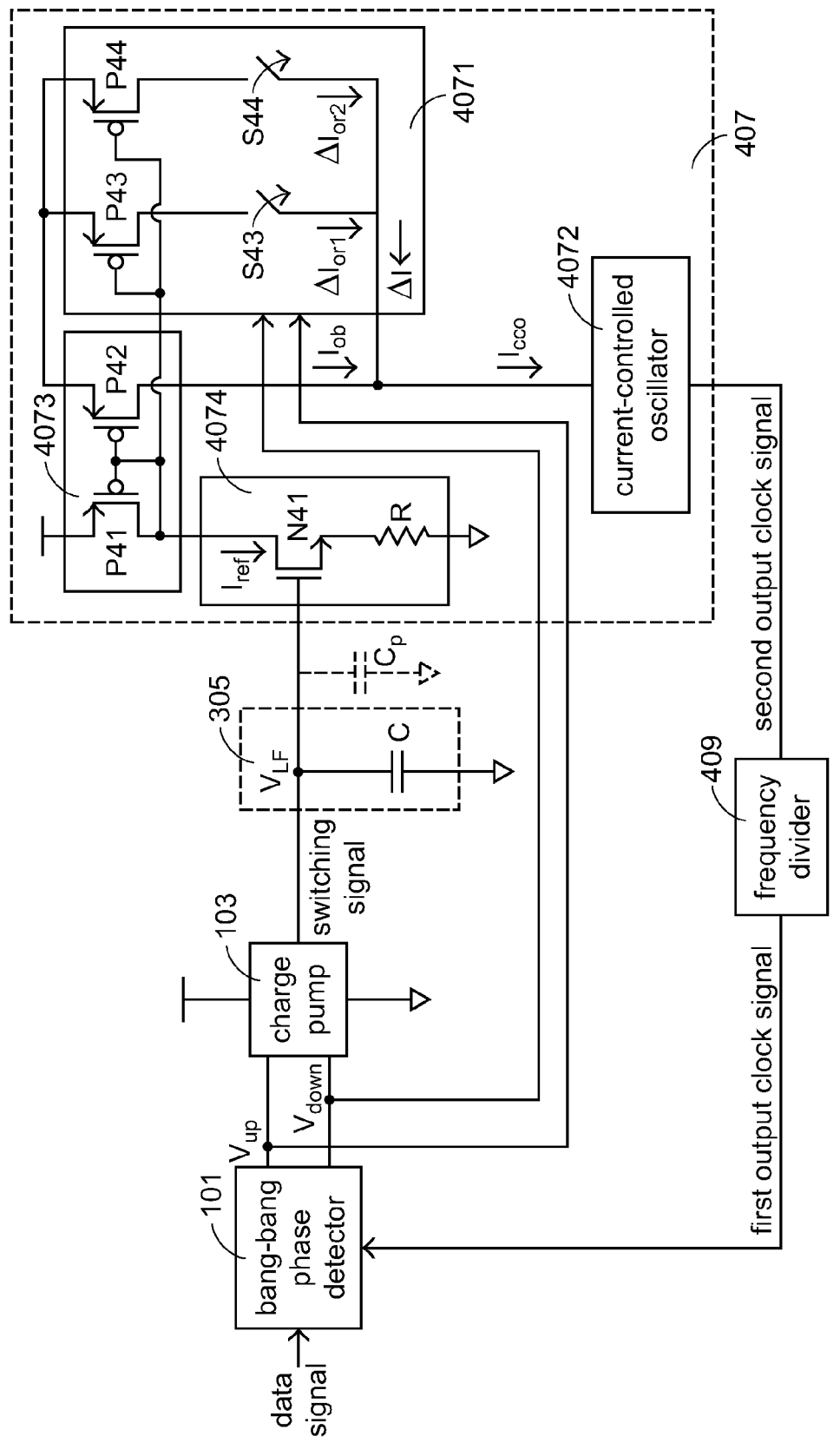
FIG. 4 is a schematic circuit diagram illustrating a clock and data recovery circuit according to an embodiment of the present invention.

FIG. 4 is a schematic circuit diagram illustrating a clock and data recovery circuit according to an embodiment of the present invention. According to the relationship between the bang-bang phase detector 101, the charge pump 103 and the loop filter 305, the clock and data recovery circuit may also be divided into a proportional path and an integral path for controlling the phase and frequency of a voltage-controlled oscillator 407.

In accordance with a key feature of the present invention, the voltage-controlled oscillator 407 is distinguishable from the conventional architecture. A current mirror 4073 comprising a first PMOS transistor P41 and a second PMOS transistor P42 serves as the main circuit of the voltage-controlled oscillator 407. The voltage-controlled oscillator 407 further comprises a current modulation module 4071, a current-controlled oscillator (CCO) 4072. The current modulation module 4071 comprises a third PMOS transistor P43, a fourth PMOS transistor P44, a third switch S43 and a fourth switch S44.

As shown in FIG. 4, the clock and data recovery circuit comprises a bang-bang phase detector 101, a charge pump 103, a loop filter 305 and a voltage-controlled oscillator 407. The bang-bang phase detector 101 compares a data signal with a first output clock signal, thereby generating a judging signal ($V_{up}$, $V_{down}$). The charge pump 103 is electrically connected to the bang-bang phase detector 101. According to the judging signal ($V_{up}$, $V_{down}$) outputted from the bang-bang phase detector 101, the charge pump 103 generates a switching signal. The loop filter 305 is electrically connected to the charge pump 103 for receiving the switching signal and generating a corresponding control voltage $V_{LF}$. The voltage-controlled oscillator 407 is connected to the loop filter 305 and the voltage-controlled oscillator 407. The voltage-controlled oscillator 407 is used for producing a second output clock signal. According to the control voltage $V_{LF}$, the frequency of the second output clock signal is adjustable. In response to a high control voltage $V_{LF}$, the frequency of the second output clock signal is relatively higher. In response to a low control voltage $V_{LF}$, the frequency of the second output clock signal is relatively lower. Moreover, the clock and data recovery circuit further comprises a frequency divider 409, which is electrically interconnected between the current-controlled oscillator 4072 and the bang-bang phase detector 101. By the frequency divider 409, the frequency f of the second output clock signal outputted from the current-controlled oscillator 4072 is divided by N (N=1, 2, 3, . . . ), so that the frequency of the first output clock signal to be inputted into the bang-bang phase detector 101 is equal to f/N. At N=1, the second output clock signal outputted from the current-controlled oscillator 4072 is directly transmitted to the bang-bang phase detector 101. Meanwhile, the first output clock signal is equivalent to the second output clock signal.

Please refer to FIG. 4 again. The current mirror 4073 of the voltage-controlled oscillator 407 has a current-controlling path and a current-outputting path. A reference output current $I_{ref}$ flows through the current-controlling path. A basic output current $I_{ob}$ flows through the current-outputting path. According to an area ratio of the first PMOS transistor P41 to the second PMOS transistor P42 of the current mirror 4073, the reference output current $I_{ref}$ and the basic output current $I_{ob}$ are in a proportional relationship. The voltage-controlled oscillator 407 further comprises a control circuit 4074. The control circuit 4074 is electrically connected to the loop filter 405 and the current-controlling path. According to the control voltage $V_{LF}$, the current $I_{cco}$ flowing through the current-controlling path is adjustable by the control circuit 4074. Moreover, according to the judging signal, the current modulation module 4071 generates a differential current ΔI. The current-controlled oscillator 4072 is electrically connected to the current-outputting path and the current modulation module 4071. As a consequence, the input current $I_{cco}$ inputted into the current-controlled oscillator 4072 is equal to the sum of the differential current ΔI and the basic output current $I_{ob}$ flowing through the current-outputting path (i.e. $\Delta I+I_{ob}=I_{cco}$). In other words, the phase of the second output clock signal is adjustable by changing the differential current ΔI.

Please refer to FIG. 4 again. The control circuit 4074 comprises a first NMOS transistor N41 and a resistor R. The drain terminal of the first NMOS transistor N41 is connected to the current-controlling path. The gate terminal of the first NMOS transistor N41 receives the control voltage $V_{LF}$. The resistor R is interconnected between the source terminal of the first NMOS transistor N41 and a low-level voltage side (e.g. a ground terminal).

The current mirror 4073 comprises the first PMOS transistor P41 and the second PMOS transistor P42. The source terminal of the first PMOS transistor P41 is connected to a high-level voltage side (e.g. a voltage source). The gate terminal and the drain terminal of the first PMOS transistor P41 are connected to the current-controlling path. The source terminal of the second PMOS transistor P42 is also connected to the high-level voltage side (e.g. a voltage source). The gate terminal of the second PMOS transistor P42 is connected to the current-controlling path. The drain terminal of the second PMOS transistor P42 is connected to the current-outputting path for outputting the basic output current.

The current modulation module 4071 comprises the third PMOS transistor P43, the fourth PMOS transistor P44, the third switch S43 and a fourth switch S44. The source terminal of the third PMOS transistor P43 is connected to the high-level voltage side (e.g. a voltage source). The gate terminal of the third PMOS transistor P43 is connected to the current-controlling path. The drain terminal of the third PMOS transistor P43 outputs a first sub-differential current $\Delta I_{or1}$ to the current-outputting path. The third switch S43 is interconnected between the third PMOS transistor P43 and the current-controlled oscillator 4072. According to the judging signal, the third switch S43 is conducted or shut off to determine whether the first sub-differential current $\Delta I_{or1}$ is outputted to the current-outputting path. For example, when the third switch S43 is conducted (in the on status), the first sub-differential current $\Delta I_{or1}$ is outputted to the current-outputting path. Meanwhile, the input current $I_{cco}$ inputted into the current-controlled oscillator 4072 is equal to the sum of the first sub-differential current $\Delta I_{or1}$ and the basic output current $I_{ob}$. As such, the phase of the second output clock signal is changed by a first ratio r1, where the first ratio r1 is a ratio of the first sub-differential current $\Delta I_{or1}$ to the basic output current $I_{ob}$.

Similarly, the source terminal of the fourth PMOS transistor P44 is connected to the high-level voltage side (e.g. a voltage source). The gate terminal of the fourth PMOS transistor P44 is connected to the current-controlling path. The drain terminal of the fourth PMOS transistor P44 outputs a second sub-differential current $\Delta I_{or2}$ to the current-outputting path. The fourth switch S44 is interconnected between the fourth PMOS transistor P44 and the current-controlled oscillator 4072. According to the judging signal, the fourth switch S44 is conducted or shut off to determine whether the second sub-differential current $\Delta I_{or2}$ is outputted to the current-outputting path. For example, when the fourth switch S44 is conducted (in the on status), the second sub-differential current $\Delta I_{or2}$ is outputted to the current-outputting path. As such, the phase of the second output clock signal is changed by a second ratio r2, where the second ratio r2 is a ratio of the second sub-differential current $\Delta I_{or2}$ to the basic output current $I_{ob}$. The number of respective pairs of the PMOS transistors and the switches may be varied according to practical requirements in order to adjust the current ratio and the second output clock signal more diversely.

In the clock and data recovery circuit of FIG. 4, the input current $I_{cco}$ inputted into the current-controlled oscillator 4072 is equal to the sum of the differential current ΔI and the basic output current $I_{ob}$ flowing through the current-outputting path. In addition, depending on the on/off statuses of the third PMOS transistor P43 and the PMOS transistor P44, the differential current ΔI is adjustable. For example, when the third PMOS transistor P43 and the PMOS transistor P44 are both in the on statuses, the differential current ΔI is equal to the sum of the first sub-differential current $\Delta I_{or1}$ and the second sub-differential current $\Delta I_{or2}$ (i.e. $\Delta I=\Delta I_{or1}+\Delta I_{or2}$). That is, the output oscillation frequency of the current-controlled oscillator 4072 is adjustable according to the differential current ΔI.

In some embodiments, when the second PMOS transistor P42 and the third PMOS transistor P43 are both turned on, the current $I_{cco}=I_{ob}+\Delta I_{or1}$ may be set as a normal current corresponding to a normal oscillation frequency of the current-controlled oscillator 4072. Meanwhile, the second output clock signal in this setting mode is referred as a standard clock signal. When the second PMOS transistor P42, the third PMOS transistor P43 and the fourth PMOS transistor P44 are all in the on statuses, the input current $I_{cco}$ of the current-controlled oscillator 4072 increases to $I_{cco}=I_{ob}+\Delta I_{or1}+\Delta I_{or2}$. In comparison with the normal current, the input current $I_{cco}$ increases by $\Delta I_{or2}$, and thus the oscillation frequency of the current-controlled oscillator 4072 increases in the ratio of $\Delta I_{or2}/I_{cco}$. On the other hand, when only the second PMOS transistor P42 is in the on status, the input current $I_{cco}$ of the current-controlled oscillator 4072 decreases to $I_{cco}=I_{ob}$. In comparison with the normal current, the input current $I_{cco}$ decreases by $\Delta I_{or1}$, and thus the oscillation frequency of the current-controlled oscillator 4072 decreases in the ratio of $\Delta I_{or1}/I_{cco}$. According to the proportional relationship between the differential current ΔI and the basic output current $I_{ob}$, the bang-bang step frequency $f_{bb}$ could be precisely controlled.

In the above embodiments, the PMOS transistors of the current modulation module 4071 are connected with respective switches in series. Moreover, the switches may be triggered in a digital control manner, and the number of switches may be varied according to practical requirements. As such, the oscillation frequency of the current-controlled oscillator 4072 could be adjusted more precisely to be applied to the high-frequency applications. The above embodiments are illustrated by referring two PMOS transistors. Nevertheless, the type, number and connecting way of the transistors may be varied according to practical requirements.

Moreover, since the areas of the PMOS transistors of the current modulation module 4071 and the areas of the PMOS transistors of the current mirror 4073 have proportional relationships, the differential current inputted into the current-controlled oscillator 4072 is controllable. Even if the fabricating process of the clock and data recovery circuit is changed, the proportional relationship between the areas of the PMOS transistors of the current mirror 4073 still exists. In other words, the application scope is very wide.

Moreover, the resistor R of the control circuit 4074 may increase the linearity of the current mirror 4073. Similarly, the integral capacitor C in the integral path and the parasitic capacitor $C_p$ are considered as an equivalent capacitance $C_{eq}$.

According to the clock and data recovery circuit of the present invention, the function of the high-response part is partially executed by the current-controlled oscillator 4072. As such, the circuitry of charge pump 103 does not need to comply with the back-end circuit. In other words, the complexity of designing the charge pump 103 largely decreases. On the other hand, once the current inputted into the current-controlled oscillator 4072 is adjusted by digitally control the transistor switches, the hunting jitter will decrease from 110 ps to 25 ps. The about 80% decrease of the hunting jitter indicates that the clock and data recovery circuit of the present invention is suitable to high-speed applications.

Since the proportional path and the integral path of the clock and data recovery circuit of the present invention are separated, the parasitic capacitor $C_p$ and integral capacitor C are connected in parallel to result in an equivalent capacitance $C_{eq}$. Under this circumstance, the parasitic capacitor $C_p$ will no longer give rise to the third-order effects. Moreover, the proportional path of the clock and data recovery circuit is improved according to the present invention, so that the second-order loop is maintained.

The clock and data recovery circuit of the present invention has other advantages as follows. For example, since the high-response phase adjustment is independent of the circuitry of charge pump 103, the complexity of designing the charge pump 103 largely decreases. In addition, the tuning range may be precisely determined by digitally control the transistor switches. By means of the digital control manner, the phase adjustment may be performed in many steps. Moreover, after the proportional relationship between respective transistors is determined, the loop stability is not adversely affected by the fabricating process.

Due to the above advantages, the clock and data recovery circuit of the present invention is suitable to high-speed applications such as USB3.0 or SATA techniques.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A clock and data recovery circuit, comprising:
    a phase detector for receiving a data signal and a first output clock signal, and comparing the data signal with the first output clock signal, thereby generating a judging signal;
    a charge pump electrically connected to the phase detector for generating a switching signal according to the judging signal;
    a loop filter electrically connected to the charge pump for receiving the switching signal and generating a corresponding control voltage;
    a voltage-controlled oscillator connected to the loop filter and the phase detector for generating a second output clock signal and adjusting the frequency of the second output clock signal according to the control voltage, wherein the voltage-controlled oscillator comprises:
        a current mirror having a current-controlling path and a current-outputting path, wherein the current-controlling path and the current-outputting path are in a proportional relationship;
        a control circuit electrically connected to the loop filter and the current-controlling path for adjusting the current flowing through the current-controlling path according to the control voltage;
        a current modulation module for generating a differential current according to the judging signal; and
        a current-controlled oscillator electrically connected to the current-outputting path and the current modulation module for adjusting the phase of the second output clock signal according to the sum of the differential current and the current flowing through the current-outputting path; and
    a frequency divider electrically connected to the current-controlled oscillator for performing frequency division on the second output clock signal, thereby generating the first output clock signal.

2. The clock and data recovery circuit according to claim 1 wherein the phase detector is a non-linear phase detector.

3. The clock and data recovery circuit according to claim 1 wherein the phase detector is a bang-bang phase detector.

4. The clock and data recovery circuit according to claim 1 wherein the charge pump comprises:
    a first current source for providing a first switching current;
    a second current source for providing a second switching current;
    a first switch interconnected between the first current source and the loop filter for providing the first switching current according to the judging signal; and
    a second switch interconnected between the second current source and the loop filter for providing the second switching current according to the judging signal,
    wherein the switching signal is determined according to a combination of the first switching current and the second switching current.

5. The clock and data recovery circuit according to claim 1 wherein the loop filter comprises an integral capacitor, which is connected to the loop filter and the voltage-controlled oscillator for performing a charging or discharging operation according to the switching signal.

6. The clock and data recovery circuit according to claim 1 wherein the control circuit comprises a first NMOS transistor, which has a drain terminal connected to the current-controlling path and a gate terminal receiving the control voltage.

7. The clock and data recovery circuit according to claim 6 wherein the control circuit further comprises a resistor, which is interconnected between a source terminal of the first NMOS transistor and a low-level voltage side.

8. The clock and data recovery circuit according to claim 1 wherein the current mirror comprises:
    a first PMOS transistor having a source terminal connected to a high-level voltage side and a gate terminal and a drain terminal connected to the current-controlling path; and
    a second PMOS transistor having a source terminal connected to the high-level voltage side, a gate terminal connected to the current-controlling path and a drain terminal connected to the current-outputting path, wherein a basic output current is outputted from the drain terminal of the second PMOS transistor.

9. The clock and data recovery circuit according to claim 8 wherein the current modulation module comprises:
a third PMOS transistor having a source terminal connected to the high-level voltage side, a gate terminal connected to the current-controlling path and a drain terminal selectively outputting a first sub-differential current to the current-outputting path; and
a third switch interconnected between the third PMOS transistor and the current-controlled oscillator, wherein according to the judging signal, the third switch is selectively conducted or shut off to determine whether the first sub-differential current is transmitted to the current-outputting path.

10. The clock and data recovery circuit according to claim 9 wherein when the third switch is conducted, the first sub-differential current is transmitted to the current-outputting path, so that the phase of the second output clock signal is changed by a first ratio, wherein the first ratio is a ratio of the first sub-differential current to the basic output current.

11. The clock and data recovery circuit according to claim 9 wherein the current modulation module comprises:

a fourth PMOS transistor having a source terminal connected to the high-level voltage side, a gate terminal connected to the current-controlling path and a drain terminal selectively outputting a second sub-differential current to the current-outputting path; and
a fourth switch interconnected between the fourth PMOS transistor and the current-controlled oscillator, wherein according to the judging signal, the fourth switch is selectively conducted or shut off to determine whether the second sub-differential current is transmitted to the current-outputting path.

12. The clock and data recovery circuit according to claim 11 wherein when the fourth switch is conducted, the first sub-differential current is transmitted to the current-outputting path, so that the phase of the second output clock signal is changed by a second ratio, wherein the second ratio is a ratio of the second sub-differential current to the basic output current.

13. The clock and data recovery circuit according to claim 11 wherein the differential current is equal to the sum of the first sub-differential current and the second sub-differential current, and the input current of the current-controlled oscillator is equal to the sum of the differential current and the basic output current.

* * * * *